US007285376B2

(12) United States Patent
Hiraoka

(10) Patent No.: US 7,285,376 B2

(45) Date of Patent: Oct. 23, 2007

(54) CORRECTION PROCESS OF PLANOGRAPHIC PRINTING PLATE

(75) Inventor: Saburou Hiraoka, Machida (JP)

(73) Assignee: Konica Minolta Medical & Graphic Inc., Tokyo (JP)

( * ) Notice: Subject to any disclaimer, the term of this patent is extended or adjusted under 35 U.S.C. 154(b) by 25 days.

(21) Appl. No.: 10/952,303

(22) Filed: Sep. 28, 2004

(65) Prior Publication Data

US 2005/0074696 A1 Apr. 7, 2005

(30) Foreign Application Priority Data

Oct. 7, 2003 (JP) ............................ 2003-348028

(51) Int. Cl.

*G03F 7/14* (2006.01)
*G03F 7/40* (2006.01)
*B41F 1/18* (2006.01)
*B41F 7/00* (2006.01)

(52) U.S. Cl. .................. 430/302; 430/309; 101/450.1; 101/451

(58) Field of Classification Search ................ 430/302, 430/309, 401, 413, 434, 435, 306; 106/401, 106/425, 426, 481; 101/450.1, 451.1

See application file for complete search history.

(56) References Cited

U.S. PATENT DOCUMENTS

| | | | | | |
|---|---|---|---|---|---|
| 4,150,623 | A | * | 4/1979 | Hamilton | 101/466 |
| 5,112,401 | A | * | 5/1992 | Yoshida | 106/287.19 |
| 5,679,485 | A | * | 10/1997 | Suzuki et al. | 430/18 |

FOREIGN PATENT DOCUMENTS

| | | | |
|---|---|---|---|
| JP | 2001329191 | | 11/2001 |
| JP | 2001350274 | | 12/2001 |
| JP | 2004-117565 | * | 4/2004 |
| JP | 2001-329191 | * | 11/2005 |

* cited by examiner

*Primary Examiner*—Richard L. Schilling

(74) *Attorney, Agent, or Firm*—Lucas & Mercanti, LLP

(57) ABSTRACT

Disclosed are a process of correcting a planographic printing plate with an image, and a correction solution for correcting the planographic printing plate; the process comprising the steps of scraping stains at the non-image portions or undesired images at the image portions in the planographic printing plate off, and then covering the scraped portions with hydrophilic film.

6 Claims, No Drawings

CORRECTION PROCESS OF PLANOGRAPHIC PRINTING PLATE

FIELD OF THE INVENTION

The present invention relates to a correction process of a planographic printing plate, and particularly to a correction process of a planographic printing plate, in which an image formed on the planographic printing plate is corrected.

BACKGROUND OF THE INVENTION

A conventional plate making comprises the steps of imagewise exposing a planographic printing plate material (e.g., a PS plate) through originals and developing the exposed material with an alkali developer to form an image on the planographic printing plate material. However, an undesired image, so-called stripping trace, may be formed at the portions of the thus obtained printing plate where the originals are pasted up. In order to remove such an undesired image, a correction solution or an eraser solution is used.

Recently, as a computer spreads, a CTP (computer to plate) system has been developed in printing fields. In the CTP system, stripping traces do not occur on the surface of printing plates, however, when physical scraping is applied to the printing plate surface, it results in stain, which requires a correction solution or an eraser solution for correction.

A conventional correction process comprises the steps of dissolving undesired image portions or stains on a printing plate surface to remove them from the surface or covering them with a hydrophilic layer. The former process is generally used in a printing plate having a metal support, however, in a hydrophilic support (for example, a hydrophilic support in which a hydrophilic layer is provided on a paper sheet or a polyester film sheet), the hydrophilic layer may be dissolved in the correction solution to reveal the surface of the sheets.

As a countermeasure thereof, a process of covering undesired portions with a correction solution containing inorganic particles and a solvent with a hydrophilic layer is proposed (see for example, Japanese Patent O.P.I. Publication No. 2001-329191). This technique can erase the undesired image portions to be corrected but as printing proceeds employing the printing plate, an image appears on the portions resulting in stain occurrence. A process of covering undesired image portions with a correction solution containing a silane coupling agent is disclosed (see for example, Japanese Patent O.P.I. Publication No. 2003-118261). This technique can increase strength of the hydrophilic layer in which the resin is cross-linked by the silane coupling agent. However, when an image to be corrected is relatively large, the hydrophilic layer is likely to be peeled off to reveal the image under the hydrophilic layer.

SUMMARY OF THE INVENTION

An object of the invention is to provide a correction process of a planographic printing plate, capable of easily removing stains at the non-image portions or undesired images at the image portions from the planographic printing plate. Another object of the invention is to provide a correction process of a planographic printing plate exhibiting high durability to long press.

DETAILED DESCRIPTION OF THE INVENTION

The above object can be attained by the following constitution.

1. A process of correcting a planographic printing plate with an image, which has been formed on a hydrophilic support of the planographic printing plate, the process comprising the steps of scraping stains at the non-image portions or undesired images at the image portions in the planographic printing plate off, and then covering the scraped portions with a hydrophilic film.

2. The process of item 1 above, wherein the covering step is carried out by coating a correction solution on the scraped portions to form a hydrophilic film, and drying the film.

3. The process of item 2 above, wherein the drying step is carried out by blowing air of not less than 50° C. to the film.

4. The process of item 2 above, wherein the correction solution contains one or more selected from the group consisting of silicon oxide particles, aluminum oxide particles, zinc oxide particles, titanium oxide particles, and zirconium oxide particles, each having an average particle diameter of from 1 to 100 nm.

5. The process of item 4 above, wherein the average particle diameter is from 3 to 50 nm.

6. The process of item 5 above, wherein the average particle diameter is from 4 to 20 nm.

7. A correction solution for correcting a planographic printing plate with an image, wherein the correction solution contains one or more selected from the group consisting of silicon oxide particles, aluminum oxide particles, zinc oxide particles, titanium oxide particles, and zirconium oxide particles, each having an average particle diameter of from 1 to 100 nm, and water or a water soluble organic solvent having a solubility at 25° C. water of not less than 10% by weight.

8. The process of item 7 above, wherein the average particle diameter is from 3 to 50 nm.

9. The process of item 8 above, wherein the average particle diameter is from 4 to 20 nm.

10. The process of item 7 above, wherein the water soluble organic solvent is selected from the group consisting of a lower alcohol, acetone and methyl ethyl ketone.

1-1. A process of correcting an image formed on a hydrophilic support of a planographic printing plate, the process comprising the steps of scraping portions to be corrected, and then covering the scraped portions with a hydrophilic film.

1-2. The process of item 1-1 above, wherein the covering step is carried out by coating a correction solution on the scraped portions to form a hydrophilic film and drying it.

1-3. The process of item 1-2 above, wherein the drying step is carried out by blowing hot air of not less than 50° C. to the film.

1-4. The process of item 1-2 or 1-3 above, wherein the correction solution contains one or more selected from the group consisting of silicon oxide particles, aluminum oxide particles, zinc oxide particles, titanium oxide particles, and zirconium oxide particles each of which has a particle diameter of from 1 to 100 nm.

Next, the present invention will be explained in detail.

The correction process of the present invention, correcting an image formed on a hydrophilic-support of a planographic printing plate, is characterized in that the process comprises the steps of scraping portions to be corrected on the hydrophilic support, and then covering the scraped portions with a hydrophilic film.

The scraping step comprises scraping, with a sand paper, a water-resistant glass paper, a compound or a rubber, portions to be corrected, including an image and/or the surface near the image of a hydrophilic support. The scraping removes stains at the non-image portions or the whole or a part of ink receptive images, or gives roughness to the scraped portions or vicinity thereof. The roughness makes it easy for the hydrophilic film to be adhered to or fixed onto the scraped portions in the succeeding hydrophilic film covering step.

The hydrophilic film covering step is carried out, for example, by coating a correction solution described later employing a swab or a paint-brush on the scraped portions or dropping the correction solution on the scraped portions, and drying it. It is preferred that the coating is carried out to completely cover the scraped portions.

In the invention, after the correction solution was coated on the scraped portions to form a hydrophilic film, the film is dried employing a hot air of preferably not less than 50° C., and more preferably not less than 100° C. The upper limit of the drying temperature is not specifically limited, but is preferably not more than 150° C. The drying step increases strength of the hydrophilic film obtained from the correction solution, and gives high durability to long press. As a method of drying employing a hot air of not less than 50° C., there is, for example, a method, which blows the hot air employing a dryer to a hydrophilic film formed by coating the correction solution.

The correction solution of the invention contains one or more selected from the group consisting of silicon oxide particles, aluminum oxide particles, zinc oxide particles, titanium oxide particles, and zirconium oxide particles, and water or a water soluble organic solvent. Each of these particles has an average particle diameter of from 1 to 100 nm, preferably from 3 to 500 nm, and more preferably from 4 to 20 nm. When the correction solution containing these particles is coated on the scraped portions and dried, the particles are closely packed to form a hydrophilic film. These particles form a hydrophilic film, and therefore are suitable as the component contained in the correction solution for a planographic printing plate. The correction solution of the invention contains the particles in an amount of preferably from 5 to 15% by weight.

The average particle diameter of the particles herein is measured by the following method. The particle diameter of the particles is observed by means of a scanning electron microscope S-800 (produced by HITACHI SEISAKUSHO Co., Ltd.), and measured at a magnification of 20,000. The particle diameters of one hundred particles are measured, and the average is calculated and defined as the average particle diameter in the invention. Herein, the particle diameter of the particles is defined as a diameter of the largest circle circumscribing projected image of the particle.

Silicon oxide particles are especially preferred, since a film consisting of silicon oxide particles is excellent in strength and water resistance. As the silicon oxide particles used in the invention, there are those available on the market, for example, Snowtex series produced by Nissan Chemical Industries, Ltd. or LUDOX series produced by Toray Industries, Inc.

A hydrophilic resin may be contained in the correction solution of the invention, as long as it does not lower water resistance. Examples of the hydrophilic resin include an acryl resin, a polyvinyl resin, a polysaccharide, a polyurethane resin, a polyester resin, and a polyamine resin, each having in the side chain one or more kinds of a hydrophilic functional group selected from a carboxyl group, a phosphate group, a sulfonic acid group, an amino group or their salt group, a hydroxyl group, an amido group, and a polyoxyethylene group. The hydrophilic resin content of the correction solution is preferably from 0 to 10% based on the total solid content in the correction solution.

The correction solution of the invention may contain a cross-linking agent in increasing strength of a film from the solution. Examples of the cross-linking agent include a melamine resin, an isocyanate compound, a polyamide resin, a polyamine resin, and a metal alkoxide. The cross-linking agent content of the correction solution is preferably from 0 to 5% based on the total solid content in the correction solution.

A solvent used in the correction solution of the invention is preferably water or a water-soluble organic solvent. Herein, the water soluble organic solvent implies an organic solvent having a solubility at 25° C. water of not less than 10% by weight. Examples thereof include lower alcohols (for example, methanol, ethanol and isopropyl alcohol), acetone, and methyl ethyl ketone. The water soluble organic solvent has a solubility at 25° C. water of not less than 10% by weight.

<Planographic Printing Plate Used in the Invention>

As planographic printing plates used in the invention, there are a planographic printing plate having an image prepared from a PS plate or CTP comprising a surface roughened support, a so-called grained support and provided thereon, a light sensitive or heat sensitive layer containing a photopolymerizable composition, a diazo resin, or a quinonediazide compound; a master plate on which an image is formed according to a laser printer or an ink jet printer; and an imagewise exposed processless CTP disclosed in Japanese Patent O.P.I. Publication Nos. 7-1849, 7-1850, 9-123387, 2000-221667, and 2001-96710, wherein a printing plate can be prepared by only exposure and applied to printing.

EXAMPLES

The present invention will be explained below employing examples, but is not limited thereto.

<Preparation of Planographic Printing Plate Material>

A PET sheet with a thickness of 188 μm and a length of 1000 m, and a first subbing layer coating liquid having the following composition was coated on the resulting sheet with a wire bar at 20° C. and 55% RH to give a dry thickness of 0.4 μm. After that, the sheet was allowed to pass through a 140° C. dry zone with a length of 15 m at a transportation speed of 15 m/minute to provide a first subbing layer.

Subsequently, the first subbing layer surface was corona discharged, and a second subbing layer coating liquid having the following composition was coated on the corona discharged surface with a air knife at 35° C. and 22% RH to give a dry thickness of 0.1 μm. After that, the sheet was allowed to pass through a 140° C. dry zone with a length of 15 m at a transportation speed of 15 m/minute to provide a second subbing layer. Thus, a subbing layer consisting of the first and second subbing layers was provided on the PET sheet.

| (First Subbing Layer Coating Liquid Composition) | |
|---|---|
| Acryl latex particles (Acryl: n-BA/tert-BA/St/HEMA (28/22/25/25 by mol) | 36.9% by weight |
| Surfactant (A) | 0.36% by weight |
| Hardener (a) | 0.98% by weight |

Water was added to the above composition to make a 1000 ml first subbing layer coating liquid.

In the above, n-BA, tert-BA, St, and HEMA represent n-butyl acrylate, tert-butyl acrylate, styrene, and 2-hydroxyethyl methacrylate, respectively.

| (Second Subbing Layer Coating Liquid Composition) | |
|---|---|
| Gelatin | 9.6% by weight |
| Surfactant (A) | 0.4% by weight |
| Hardener (b) | 0.1% by weight |

Water was added to the above composition to make a 1000 ml second subbing layer coating liquid.

Surfactant (A)

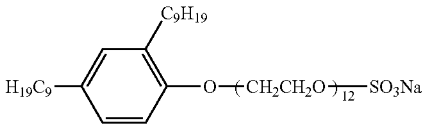

Hardener (a)

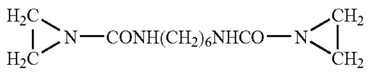

Hardener (b)

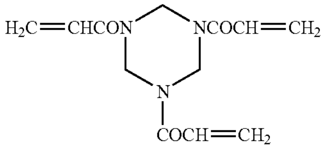

<Formation of Hydrophilic Layer>

The following hydrophilic layer coating liquid was coated on the subbed PET sheet above employing a wire bar #5, and the coated sheet was allowed to pass through a 100° C. drying zone with a length of 15 m at a transportation speed of 15 m/minute, and further subjected to aging treatment at 60° C. for 24 hours to give to obtain a hydrophilic layer with a coating amount of 2.0 g/m$^2$.

(Preparation of Hydrophilic Layer Coating Liquid)

The following materials (a), (b) and (c) were mixed to obtain an aqueous dispersion having a solid content of 28.8%.

| | |
|---|---|
| (a) Colloidal silica (Snowtex S, 30% solid content, produced by Nissan Kagaku Kogyo Co., Ltd.) | 17.34 parts by weight |
| (b) Colloidal silica (Snowtex PS-M, 20% solid content, produced by Nissan Kagaku Kogyo Co., Ltd.) | 38.89 parts by weight |

-continued

| | |
|---|---|
| (c) Aluminosilicate particles (AMT Silica 08 having an average particle diameter of 0.6 μm, produced by Mizusawa Kagaku Kogyo Co., Ltd. | 4.50 parts by weight |

The following composition was added to the above aqueous dispersion, and dispersed in a homogenizer for one hour to prepare a hydrophilic layer coating liquid.

| | |
|---|---|
| Aqueous 4% solution of sodium carboxymethyl cellulose (produced by Kanto Kagaku Co., Ltd.) | 5.00 parts by weight |
| Fe-Mn-Cu composite metal oxide (MF Black 4500, 40% aqueous dispersion, produced by Dainichi Seika Kogyo Co., Ltd.) | 4.50 parts by weight |
| Aqueous 5% solution of Montmorillonite (BENGEL 31, produced by Hojun Yoko Co., Ltd.) | 8.00 parts by weight |
| Aqueous 1% solution of silicon-contained surfactant (FZ-2161, produced by Nippon Unicar Co., Ltd.) | 2.27 parts by weight |
| Aqueous 10% solution of $Na_3PO_4$ (produced by Kanto Kagaku Co., Ltd.) | 1.00 part by weight |
| Pure water | 18.69 parts by weight |

<Formation of Image Formation Layer>

The following image formation layer coating liquid 1 was coated on the resulting hydrophilic layer employing a wire bar #5, and allowed to pass through a 60° C. drying zone with a length of 15 m at a transportation speed of 15 m/minute to give to obtain an image formation layer with a coating amount of 0.5 g/m$^2$. The resulting material was further subjected to aging treatment at 50° C. for 24 hours to obtain a planographic printing plate material sample.

| (Image Formation Layer Coating Liquid 1) | |
|---|---|
| Aqueous carnauba wax particle (with an average particle diameter of 0.5 μm) dispersion (Hi-Disperser A118 having a solid content of 40% by weight produced by Gifu Shellac Co., Ltd.) | 7.50 parts by weight |
| Trehalose (Treha, produced by Hayashihara Shoji Co., Ltd.) | 2.00 parts by weight |
| Pure water | 90.50 parts by weight |

The resulting planographic printing plate material was mounted on a drum of a plate setter equipped with a 830 nm semiconductor laser having an output power of 300 mW and a beam diameter of 32 μm (1/e$^2$), and imagewise exposed to record a solid image, an image of a 2% screen tint with a screen line number of 175 and an image of a 50% screen tint with a screen line number of 175, wherein the drum rotation number was adjusted so that exposure energy intensity on the surface of the material was 300 mJ/cm$^2$. Subsequently, the exposed sample was mounted on a plate cylinder (with a diameter of 135 mm) of an off-set printing press LITHRONE 20, and printing was carried out to obtain 100 prints. The resulting prints exhibited good reproduction of the solid image, and the image of the 2% screen tint and 50% screen tint with a screen line number of 175.

<Preparation of Correction Solution>

A correction solution was prepared which had the following composition.

TABLE 1

| Correction Solution No. | Composition | Parts by Weight |
|---|---|---|
| 1 | Colloidal Silica (Methanol Snowtex, solid content of 30%, produced by Nissan Chemical Industries, Ltd., average particle diameter: 15 nm) | 33.4 |
| | Isopropyl alcohol | 66.6 |
| 2 | Colloidal Silica (methanol Snowtex, solid content of 30%, produced by Nissan Chemical Industries, Ltd., average particle diameter: 15 nm) | 26.6 |
| | Aqueous alumina dispersion (Alumina Sol 520, solid content of 21%, produced by Nissan Chemical Industries, Ltd., average particle diameter: 13 nm) | 9.5 |
| | Isopropyl alcohol | 63.9 |
| 3 | Aqueous zirconina dispersion (Zircosol AC-7, solid content of 13%, produced by Daiichi Kigenso Kagaku Kogyo Co., Ltd., average particle diameter: 8 nm) | 30.7 |
| | Aqueous silica dispersion (Snowtex XS, solid content of 20%, produced by Nissan Chemical Industries, Ltd., average particle diameter: 4 nm) | 30.0 |
| | Pure Water | 39.3 |

<Evaluation>

After 100 prints were obtained, a part of each of the image of the 2% screen tint, the image of the 50% screen tint and the solid image of the planographic printing plate material was not scraped, or was scraped with a water-proof sand paper one time, five times, or ten times. Successively, the correction solution obtained above was coated on the resulting image part and then dried at 60° C. or at 100° C. employing a dryer, or air dried. Employing the resulting planographic printing plate material, printing was further carried out, and the number of sheets printed until the image part appeared (in other words, a film formed from the correction solution was peeled off) was counted.

TABLE 2

| Treat-ment | Scraping Time | Correction Solution | Drying | Number of Sheets Printed until Image Part Appeared: 2% screen tint | 50% screen tint | Solid Image |
|---|---|---|---|---|---|---|
| 1 | None | No. 1 | Air Drying | 300 | 150 | 100 |
| 2 | | | Dryer (100° C.) | 500 | 200 | 150 |
| 3 | 5 | | Air Drying | 18000 | 18000 | 15000 |
| 4 | | | Dryer (100° C.) | 25000 | 25000 | 25000 |
| 5 | 20 | | Air Drying | 18000 | 20000 | 15000 |
| 6 | | | Dryer (60° C.) | 23000 | 20000 | 20000 |
| 7 | 5 | No. 2 | Dryer (100° C.) | 25000 | 25000 | 25000 |
| 8 | 5 | No. 3 | Dryer (100° C.) | 25000 | 25000 | 25000 |

As is apparent from Table 2, a correction process comprising the step of carrying out scraping before a correction solution is coated exhibits a long press life. Further, a correction process comprising the step of drying the coated correction solution blowing hot air exhibits a longer press life.

As is apparent from the above results, the correction process of the invention, comprising the steps of scraping image portions to be corrected, and then covering the scraped image portions with a hydrophilic film, does not deteriorate the corrected portions on the printing plate are not deteriorated irrespective of the number of prints.

EFFECT OF THE INVENTION

The present invention can provide a correction process of a planographic printing plate, capable of easily removing stains at the non-image portions or undesired images at the image portions from the planographic printing plate, and provide a correction process of a planographic printing plate exhibiting high durability to long press.

What is claimed is:

1. A process for correcting a planographic printing plate with an image, which has been formed on a hydrophilic support of a planographic printing plate, the process comprising the steps of:

forming an image on a planographic printing plate;

printing said image using said printing plate;

scraping off stains at non-image portions or undesired image portions from said printing plate which had been used for printing to form scraped portions on said printing plate; and covering the scraped portions with a hydrophilic film to correct said printing plate.

2. The process of claim 1, wherein the covering step is carried out by coating a correction solution on the scraped portions to form a hydrophilic film, and drying the film.

3. The process of claim 2, wherein the drying step is carried out by blowing air of not less than 50° C. to the film.

4. The process of claim 2, wherein the correction solution contains one or more selected from the group consisting of silicon oxide particles, aluminum oxide particles, zinc oxide particles, titanium oxide particles, and zirconium oxide particles, each having an average particle diameter of from 1 to 100 nm.

5. The process of claim 4, wherein the average particle diameter is from 3 to 50 nm.

6. The process of claim 5, wherein the average particle diameter is from 4 to 20 nm.

* * * * *